(12) United States Patent
Mostafazadeh

(10) Patent No.: US 7,514,769 B1
(45) Date of Patent: Apr. 7, 2009

(54) MICRO SURFACE MOUNT DIE PACKAGE AND METHOD

(75) Inventor: Shahram Mostafazadeh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 149 days.

(21) Appl. No.: 11/202,797

(22) Filed: Aug. 13, 2005

(51) Int. Cl.
*H01L 23/02* (2006.01)

(52) U.S. Cl. .............. 257/678; 257/737; 257/738; 257/723; 257/787; 257/788; 257/789

(58) Field of Classification Search ............ 257/723, 257/787–796, 737–738, 730, 773, 666, 676, 257/678; 438/110–114, 124, 127
See application file for complete search history.

(56) References Cited

U.S. PATENT DOCUMENTS

| | | | |
|---|---|---|---|
| 5,864,174 A | 1/1999 | Yamada et al. | |
| 6,075,290 A | 6/2000 | Schaefer et al. | |
| 6,093,972 A | 7/2000 | Carney et al. | |
| 6,133,634 A | 10/2000 | Joshi | |
| 6,157,086 A | 12/2000 | Weber | |
| 6,204,095 B1 | 3/2001 | Farnworth | |
| 6,245,595 B1 | 6/2001 | Nguyen et al. | |
| 6,468,832 B1 | 10/2002 | Mostafazadeh | |
| 6,495,914 B1 * | 12/2002 | Sekine et al. | 257/723 |
| 6,537,848 B2 * | 3/2003 | Camenforte et al. | 438/106 |
| 7,091,581 B1 * | 8/2006 | McLellan et al. | 257/673 |
| 7,122,401 B2 * | 10/2006 | Song | 438/108 |
| 7,242,085 B2 * | 7/2007 | Hosoya | 257/699 |
| 2001/0048116 A1 * | 12/2001 | Standing et al. | 257/177 |
| 2004/0188700 A1 * | 9/2004 | Fukasawa et al. | 257/100 |
| 2005/0087861 A1 * | 4/2005 | Burtzlaff et al. | 257/704 |
| 2006/0150381 A1 * | 7/2006 | Anzai et al. | 29/25.35 |
| 2006/0154403 A1 * | 7/2006 | McLellan et al. | 438/113 |

\* cited by examiner

*Primary Examiner*—Phuc T Dang
*Assistant Examiner*—Thanh Y Tran
(74) *Attorney, Agent, or Firm*—Beyer Law Group LLP

(57) ABSTRACT

A micro surface mount die package is described that includes a die attach pad having a plurality of integrally formed risers. A bumped die is mounted on the die attach pad such that the risers are located to the side of the die and the contact bumps face away from the die attach pad. An encapsulant covers the active and side surfaces of the die while leaving the contact bumps exposed on the packaged semiconductor device. Methods for forming such packages and panels suitable for use in forming such packages are also described.

14 Claims, 3 Drawing Sheets

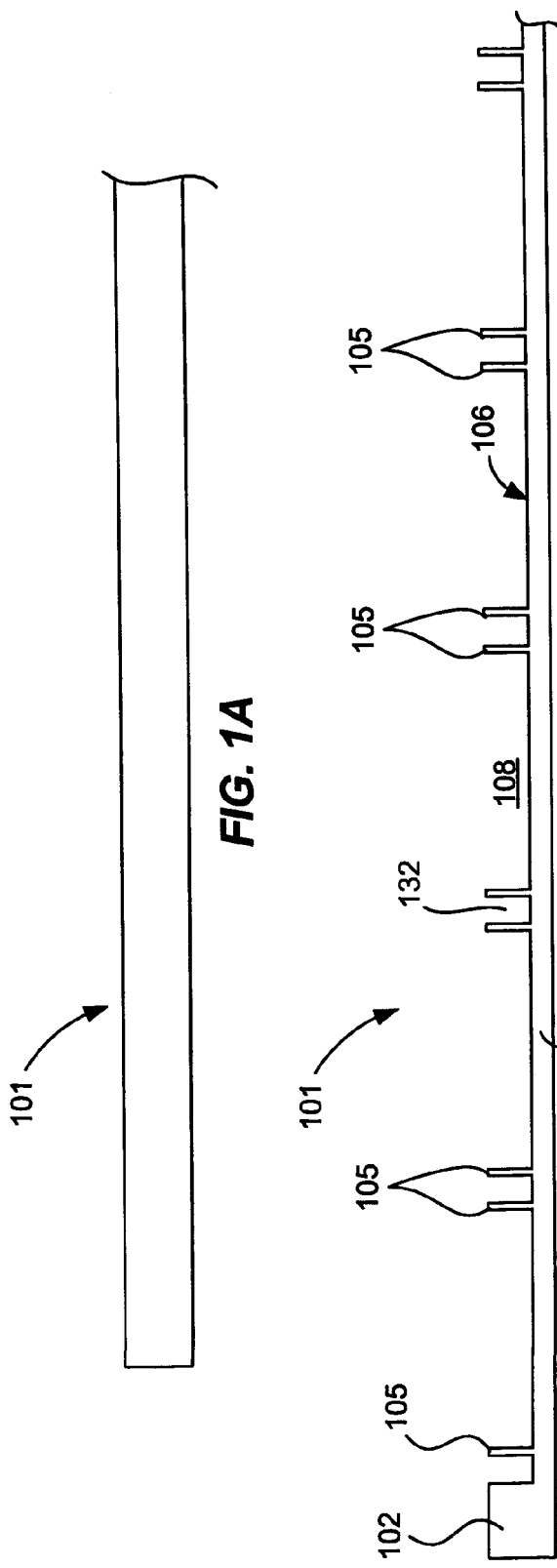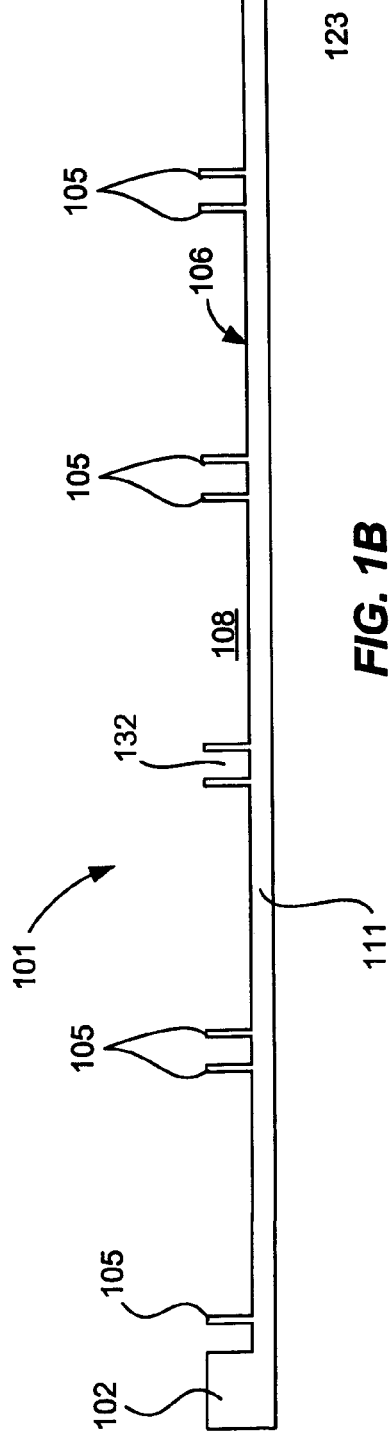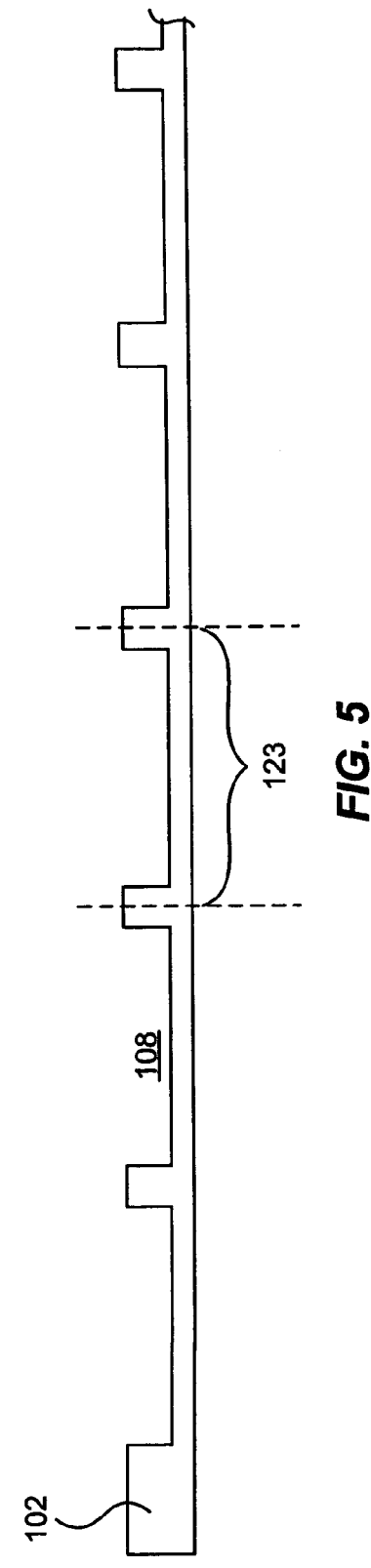

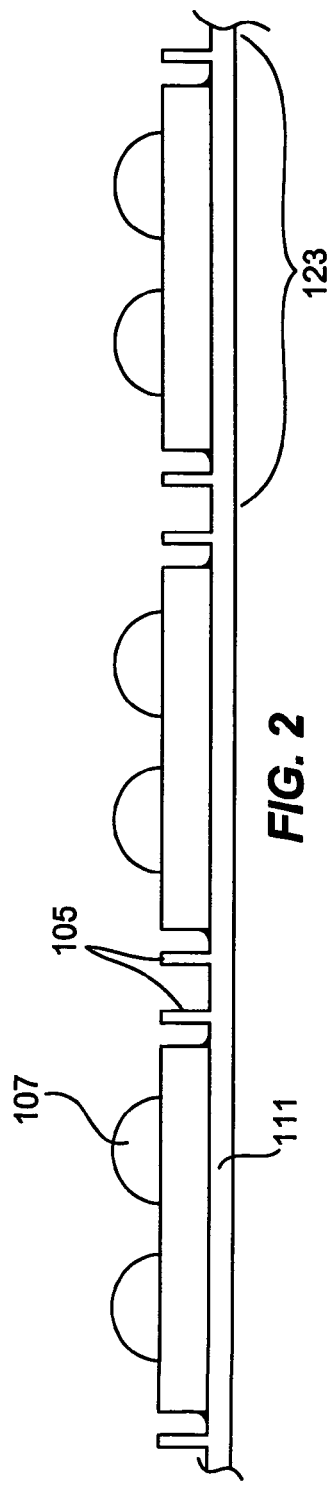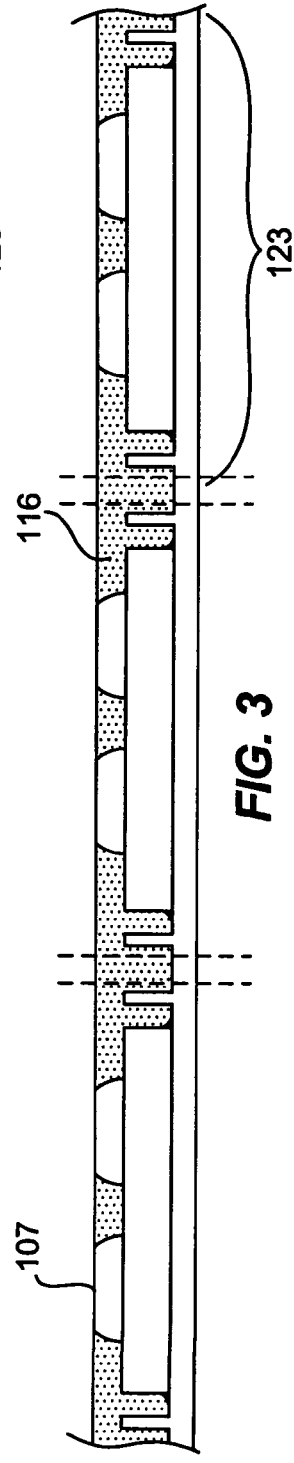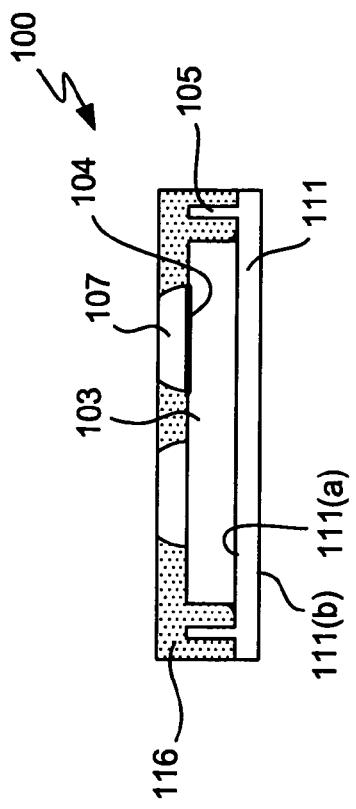

US 7,514,769 B1

MICRO SURFACE MOUNT DIE PACKAGE AND METHOD

BACKGROUND OF THE INVENTION

The present invention relates generally to the packaging of integrated circuits. More particularly, improved micro surface mount die package arrangements are described.

There are a number of conventional processes for packaging integrated circuits. One approach that is commonly referred to as "flip chip" packaging generally contemplates forming solder bumps (or other suitable contacts) directly on the face of an integrated circuit die. In some situations, the contacts are formed directly on I/O pads formed on the die, whereas in other situations the contacts are redistributed. The die is then typically attached to a substrate such as a printed circuit board or package substrate such that the die contacts directly connect to corresponding contacts on the substrate.

An extension of flip chip technology is the micro surface mount die package (µSMD), which is a chip scale package design. Typically, in a micro surface mount die package, the dice are bumped to form the external contacts, but portions of the die are encapsulated or otherwise covered with a suitable protective material. There have been a wide variety of µSMD package designs that have been proposed. By way of example, U.S. Pat. Nos. 6,023,094, 6,245,595 and 6,468,832 disclose some representative designs. The '094 patent and other related patents describe a wafer level arrangement for applying a protective coating to the back surface of the die. The '595 patent and other related patents describe wafer level arrangements for applying an underfill coating to the active surface of a die. The '832 patent describes a micro surface mount die package that includes a die attach pad that forms the back surface of a package.

Although all of these designs work well, there are continuing efforts to provide improved micro surface mount die packages that work particularly well in various specific applications.

SUMMARY OF THE INVENTION

In one aspect of the present invention, an improved package is described that includes a die attach pad having a plurality of integrally formed risers. A bumped die is mounted on the die attach pad such that the risers are located to the side of the die and the contact bumps face away from the die attach pad. An encapsulant covers the active and side surfaces of the die while leaving the contact bumps exposed on the packaged semiconductor device.

In some preferred embodiments, the risers are provided on each side of the die and are linked to form a continuous rim. The rim defines a cavity that receives the die. Typically, the risers do not extend along the edge of the package, although this is not a requirement.

In another aspect of the invention, a panel suitable for use in the packaging of such devices is described. The panel includes a conductive sheet that is patterned to define a plurality of device areas that are arranged in at least one two dimensional array. Each device area has a die attach region and a plurality of integrally formed risers. In some embodiments, the risers are arranged as a matrix or double matrix that define the die attach regions.

A bumped die is secured to each of the die attach regions each such that the risers in the associated device area are located to the side of the die and the contact bumps pads face away from the conductive sheet. An encapsulant covers the active and side surfaces of the dice while leaving the contact bumps exposed on a first surface of the panel. The panel also typically includes handling rails formed along at least two opposing edges of the panel to facilitate handling during the packaging process. The thickness of the handling rails is substantially the same as the thickness of the risers.

In a method aspect of the invention, the conductive sheet may be patterned from a blank to define the device areas by etching wells and streets into the top surface of the blank. After the dice are attached to the panel, an encapsulant may be applied to cover the top and side surfaces of the dice. A wide variety of conventional encapsulation techniques including molding, dispensing, printing (e.g. screen or stencil printing) may be used to apply the encapsulant. After the panel has been populated and encapsulated, the panel may be singulated to provide a plurality of packaged integrated circuited devices.

In some arrangements it may be desirable to grind the top surface of the encapsulant after encapsulation to better expose the contact bumps.

BRIEF DESCRIPTION OF THE DRAWINGS

The invention, together with further objects and advantages thereof, may best be understood by reference to the following description taken in conjunction with the accompanying drawings in which:

FIG. 1(a) is a diagrammatic cross sectional view of a conductive panel blank;

FIG. 1(b) is a diagrammatic cross sectional view of a conductive panel of FIG. 1(a) after patterning in a manner that is suitable for use in conjunction with the present invention;

FIG. 2 is a diagrammatic cross sectional view of the panel illustrated in FIGS. 1(b) & 1(c) after it has been populated by bumped integrated circuits.

FIG. 3 is a diagrammatic cross sectional view of the panel illustrated in FIG. 2 after encapsulation.

FIG. 4 is a diagrammatic cross sectional view of a packaged semiconductor die that has been singulated from the panel illustrated in FIG. 3;

FIG. 5 is a diagrammatic cross sectional view of an alternative embodiment of the conductive panel that does not include saw streets.

In the drawings, like reference numerals designate like structural elements. It should also be understood that the depictions in the figures are diagrammatic and not to scale.

DETAILED DESCRIPTION OF THE PREFERRED EMBODIMENTS

Figure 1C:
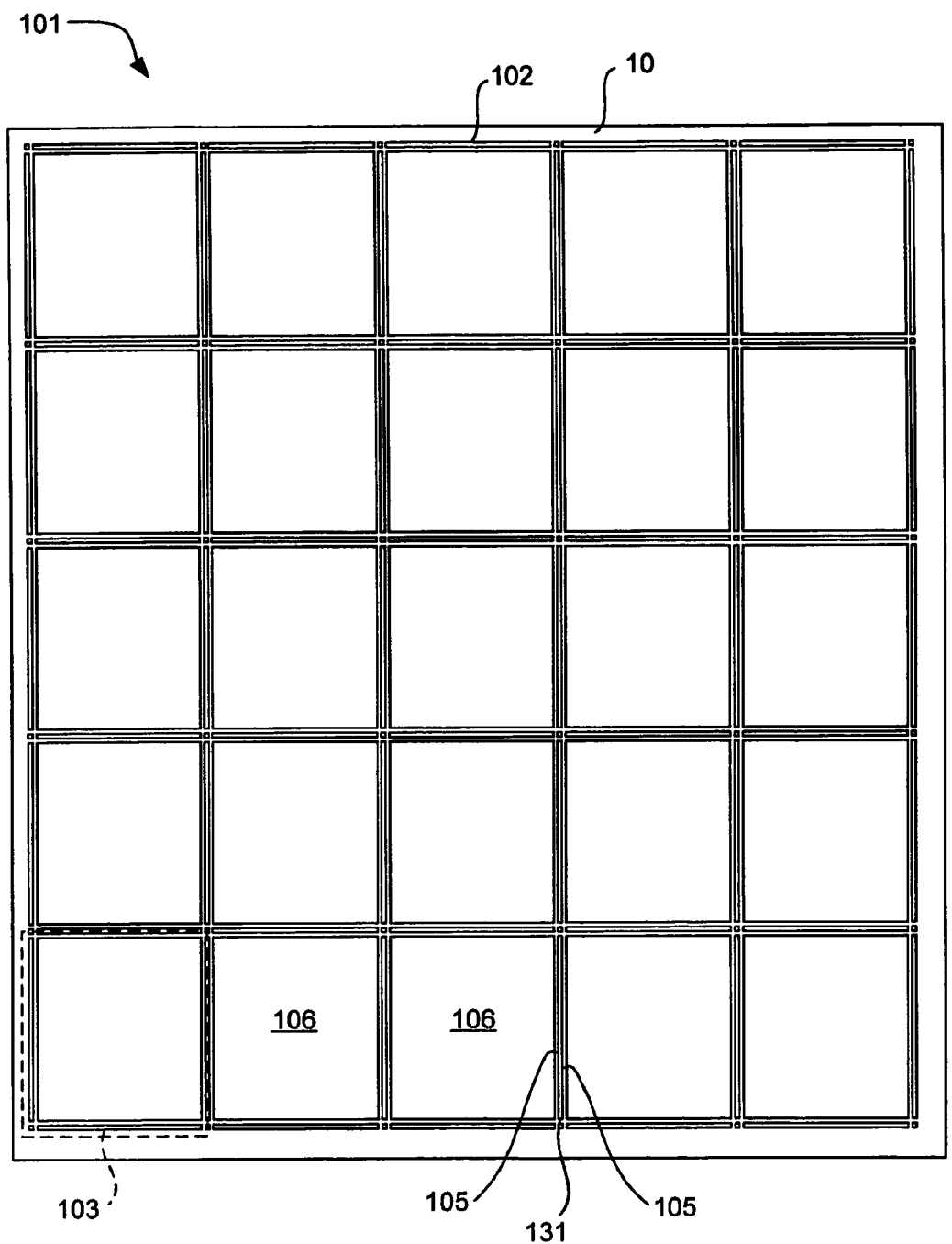
FIG. 1(c) is a diagrammatic top view of the patterned conductive panel illustrated in FIG. 1(b)

The present invention relates generally to micro surface mount die (µSMD), package designs. The embodiments illustrated in the drawings might be considered a modification of the arrangement described in U.S. Pat. No. 6,468,832 which was referenced above. In the '832 patent, a number of flip chip style dice are mounted on a conductive die attach panel (e.g., a lead frame panel or strip). The panel has a two dimensional array of device areas each having a die attach pad. A die is mounted on the die attach pad of each device area with its contact bumps facing away from the panel. The panel is then encapsulated such that the contact bump and the bottom surface of the die attach pad are exposed, but side and top portions of the die are covered by the encapsulant material. After encapsulation, the panel may be cut to form a plurality of singulated packaged micro surface mount die packages.

The invention described in the '832 patent takes advantage of the fact that there is a wide variety of semiconductor packaging handling equipment that is designed to handle lead frame panels and strips and such equipment can often be used to handle the described conductive die attach panels. As will be appreciated by those familiar with the art, most such equipment is designed to handle relatively standard thickness lead frame panels/strips. By way of example, current equipment tends to be designed to handle lead frame panels/strips having a thickness in the range of 4-8 mils, as for example 6 mils. Therefore, since a company will often (indeed typically) want to use their existing equipment in the fabrication of a new package design, the thickness of the conductive panel may be dictated by the nature of the equipment rather than the needs of a particular application.

At the same time there are a variety of applications which require very thin packages. In such an application, a 6 mil die attach pad may constitute a significant percentage of the total thickness of the package and thus it would be desirable to use a thinner conductive panel to form the die attach areas. However, in many situations it might be impractical to use a thinner panel (as for example a 3 mil panel). Initially, the thinner panels may not work well with existing handling equipment. Additionally, if the panels are too thin, they may lose enough of their structural integrity to introduce other handling difficulties. Accordingly, the present invention provides a mechanism that can be used to form thinner die attach pads than might be possible using a given piece of equipment.

Referring next to FIGS. 1(b) and 1(c) a conductive panel 101 suitable for use in the present invention will be described. The conductive panel includes integrally formed handling rails 102 (often referred to as a skirt) that extend around the outer periphery of the panel and a matrix of risers 105. The risers 105 effectively define a two dimensional array of device areas 123 on the panel. Each device area 123 has a die attach area 106 that is bounded by risers 105 on each side. The die attach area is recessed relative to the full thickness of the panel. As will be described in more detail below, the conductive panel 101 may be used to package µSMDs.

Referring next to FIG. 4 a µSMD in accordance with a first embodiment of the invention will be described. This embodiment might be considered a modification of the arrangement described in U.S. Pat. No. 6,468,832 which was referenced above. As seen in FIG. 4, a package 100 includes a flip chip style die 103 having a multiplicity of I/O pads 104 formed thereon. Conductive bumps 107 (which are typically, but not always formed from solder) are attached to the I/O pads to form the external contacts for the package 100. A die attach pad 111 is secured to the back surface of the die 103, and an encapsulant material 116 encapsulates the die while leaving at least a portion of the conductive bumps 107 and the back surface 111(b) of the die attach pad 111 exposed.

The die attach pad 111 differs from the die attach pad described in the '832 patent in that it includes integrated risers 105 that extend upward from the front surface 111(a) of the die attach pad 111 to the sides of the die 103. In the illustrated embodiment, the risers 105 are provided on all four sides of the die in a manner that encircles the die. However, in alternative implementations, fewer (e.g., one, two or three) risers may be provided and the risers do not necessarily need to be continuous.

Referring next to FIGS. 1-3, a method of forming the packages 100 illustrated in FIG. 4 using the conductive panel 101 illustrated in FIG. 1 will be described. Initially, as illustrated in FIG. 1(a), a conductive panel (which may take the form of a lead frame blank) 101 is provided. The panel may be formed from any suitable conductive material such as various metals that are commonly used in lead frames. By way of example, copper and copper alloys work well.

The panel 101 may be of any appropriate thickness. As suggested above, much of the current lead frame handling equipment is designed to handle lead frames having thicknesses in the range of 4-8 mils. Therefore, in many applications, the conductive panel may have a thickness in the range of 4-8 mils. However, it should be appreciated that the invention may be used in conjunction with conductive panels of virtually any suitable thickness, including thinner and thicker conductive panels and it is expected that as technology develops, the standard equipment handling sizes may change over time.

The blank conductive panel 101 is then etched to define the conductive panel shown and described above with respect to FIGS. 1(b) and 1(c). This is accomplished by etching wells 108 in the conductive panels to define the die attach region 106. The etching can be accomplished using any suitable etching process. The depth of the wells may be varied. By way of example, well depths in the range of approximately 30-70 percent of the thickness of the panel 101 work well in most applications (although wider ranges are possible). In many applications, well depths in the range of 40-60 percent of the panel thickness (as for example half etching) will be appropriate.

At the same time that the wells 108 are formed, the panel may be patterned to define other thinned regions of interest. Most notably, it may be desirable to provide thinned saw streets 131 to the sides of device areas 123. The saw streets are provided to improve the singulation process since it is usually easier (and cheaper in the long run) to cut through encapsulant than metal during panel sawing (or other panel cutting operations). If the saw streets are not desired for a particular application, they may be eliminated. By way of example, FIG. 5 illustrates an alternative embodiment of the conductive panel 201, which includes the wells 108 but not the saw streets 131.

It should be appreciated that if the saw streets are eliminated, then the sides of the risers will be exposed on the peripheral sides of the packaged device. With this arrangement, from an external view, the die attach pad will appear to have the full thickness of the original conductive sheet. In contrast, when the saw streets are provided, encapsulant will typically cover the sides of the risers so that from an external view, the die attach pad will appear to have only the height of the thinned regions. In such an arrangement, the ends of the risers would also be exposed.

In the described embodiment, the handling rails 102 and risers 105 remain substantially the same thickness as the thickness of the original conductive panel. As long as the conductive panel began at a thickness that is suitable for use with the packaging equipment being used, the handling rails 102 will generally insure that the conductive panels can be used with the existing handling equipment. The risers 105 provide additional structural support to the panel even after the wells 108 and saw streets 131 (if present) are etched into the panel. In the embodiment illustrated in FIG. 1(c) the risers are substantially continuous and extend the width or length of the panel between the rails 102 and effectively form a matrix. Since the embodiment shown in FIG. 1(c) has the saw streets 131, a pair of parallel risers 105 separated by a saw street 131 extend between each adjacent pair of die attach areas 106. This arrangement is sometimes referred to herein as a "double matrix."

In the illustrated embodiment the risers extend both longitudinally and laterally across the panel. However, in alternative embodiments, the risers may extend in only one direction across the panel. In still other embodiments, the risers may be arranged as separate rectangular rims around each die attach region 106. A panel employing such an arrangement does not have as good rigidity as a panel in which the risers extend the full length of the panel, however it allows the risers to be completely hidden by the encapsulant after singulation. Other non-continuous riser/rim structures could be used as well.

After the conductive panel has been patterned, bumped dice 103 (which may take the form of ordinary flip chip style dice) are mounted in the wells 108 such that each die attach pad supports an associated die. The dice are positioned such that their contact bumps 107 (which are typically formed from solder) face away from the panel 101. The dice may be attached to the die attach pads using any appropriate die attach technique, including adhesive bonding, taping, soldering, etc.

After the dice have been mounted on the panel, an encapsulant cap is formed over the dice to protect the top and side surfaces of the die. The encapsulant cap may be formed by a wide variety of techniques including molding, dispensing, screen printing, stencil printing or the like. Preferably the encapsulation is done in a manner that leaves at least some portion of the contact bumps exposed. However, this is not a requirement. Specifically, if excess encapsulant covers the contact bumps (either inadvertently or by design), the excess encapsulant can be removed by grinding or other suitable operations in order to expose the contact bumps.

The '832 patent, which is incorporated herein by reference describes a method of molding the panels which works well. However, it should be appreciated that other encapsulation techniques such as screen/stencil printing and dispensing may readily be used as well.

In some embodiments, a single encapsulant cap may be formed over the entire panel (i.e., over all of the device areas on the panel). However, in other embodiments, caps may be formed over smaller groups of device areas or the device areas could even be individually encapsulated. For example, in the illustrated embodiment, the panel 101 has only one two dimensional array of device areas thereon. As will be appreciated by those familiar with the art, there is a wide variety of equipment that is designed to handle lead frame strips having multiple blocks (i.e., two dimensional arrays) of device areas. It should be apparent that the described panels can be arranged as strips or panels that have multiple blocks of device areas that are separated by skirts, rails or other suitable support structures. In such embodiments it may be desirable to form separate caps over each block of device areas.

After the panel has been encapsulated, any additional panel level processing that is desired may be performed. For example, it may be desirable to test and/or mark the devices at the panel level. When all panel level processing is completed, the panel may be singulated. The singulation can be done using any appropriate cutting technique such as sawing, laser cutting, etc.

Although only a few embodiments of the invention have been described in detail, it should be appreciated that the invention may be implemented in many other forms without departing from the spirit or scope of the invention. Therefore, the present embodiments are to be considered as illustrative and not restrictive and the invention is not to be limited to the details given herein, but may be modified within the scope and equivalents of the appended claims.

What is claimed is:

1. A packaged semiconductor device comprising:
    a die attach pad having a plurality of integrally formed risers, the die attach pad and the plurality of integrally formed risers being integrally formed from a conductive metal material, the risers extending upward from a front surface of the die attach pad, and wherein the risers are linked to form a continuous ring that defines a cavity;
    a die having an active surface, a plurality of side surfaces, a back surface, and a plurality of contact bumps on the active surface, wherein the die is attached to the die attach pad within the cavity such that the risers are located to each side of the die and the I/O pads face away from the die attach pad; and
    an encapsulant that completely covers the risers and covers the active and side surfaces of the die while leaving the contact bumps exposed on a first surface of the packaged semiconductor device, whereby no part of the risers is exposed through the encapsulant.

2. A packaged semiconductor device as recited in claim 1 wherein the die has a height that is at least as great as the height of the risers.

3. A packaged semiconductor device as recited in claim 1 wherein the die has a height that is less than the height of the risers.

4. A packaged semiconductor device as recited in claim 1 wherein the die attach pad is formed from a copper based material.

5. A panel comprising:
    a conductive sheet having a plurality of device areas defined thereon that are arranged in at least one two dimensional array of device areas, each device area having a die attach region and a plurality of integrally formed risers, wherein the risers extend upward from a front surface of the die attach pad, and the risers are linked to form a continuous ring on each die attach pad that defines a cavity;
    a plurality of dice, each die having an active surface, a plurality of side surfaces, a back surface, and a plurality of contact bumps on the active surface, wherein each die is attached to the die attach region within an associated cavity such that the risers in the associated die attach region are located to the side of the die and the contact bumps face away from the die attach regions; and
    an encapsulant that completely covers the risers and the active and side surfaces of the dice while leaving the contact bumps exposed on a first surface of the panel, whereby no part of the risers are exposed through the encapsulant.

6. A panel as recited in claim 5 wherein:
    the conductive sheet has a plurality of two dimensional arrays of device areas thereon; and
    the encapsulant is arranged as a plurality of caps, each cap being formed over an associated two dimensional array of device areas.

7. A panel as recited in claim 5 wherein the panel further comprises handling rails formed along at least two opposing edges of the panel, wherein the thickness of the handling rails is substantially the same as the thickness of the risers.

8. A panel as recited in claim 7 wherein the thickness of the panel in the regions of the risers and handling rails is in the range of approximately 4 to 8 mils thick, and the thickness of the die attach regions of the conductive sheet are no more than approximately 60 percent of the thickness of the handling rails.

9. A method of packaging integrated circuits, the method comprising:
    etching a conductive panel to define a plurality of reduced height regions and full height regions, the reduced height regions forming die attach regions arranged in at least one two dimensional array of device areas, the full height regions forming risers surrounding each die attach region;
    mounting a plurality dice on the conductive panel, each die having a plurality of contact bumps formed on and extending from an active surface thereof, each die being mounted on an associated die attach region such that the active surface faces away from the die attach regions;

applying an encapsulant over the dice such that the encapsulant covers side and top portions of the dice and at least one side of the risers, each top of the contact bumps being exposed on a surface of the encapsulant covering the active surfaces; and singulating the panel to provide a plurality of packaged integrated circuited devices.

10. A method as recited in claim 9 wherein the etching further defines a plurality of saw streets, each saw street being formed between adjacent die attach areas thereby defining risers that are positioned to the sides of the die attach areas, and wherein during singulation, the conductive panel is cut along the saw streets.

11. A method as recited in claim 9 wherein the encapsulation is accomplished by one selected from the group consisting of molding, dispensing, screen printing or stencil printing an encapsulant.

12. A method as recited in claim 9 further comprising grinding a top surface of the encapsulant after the encapsulant has been applied in order to better expose the contact bumps.

13. The method as recited in claim 9, wherein the etching reduces the height of the reduced height regions by approximately 30-70 percent with respect to the full height regions.

14. The method as recited in claim 13, wherein the etching reduces the height of the reduced height regions by approximately 40-60 percent with respect to the full height regions.

* * * * *